(12) United States Patent
Cheng et al.

(10) Patent No.: US 8,587,462 B1
(45) Date of Patent: Nov. 19, 2013

(54) DIGITAL-TO-ANALOG CONVERTER

(71) Applicant: United Microelectronics Corp., Hsin-Chu (TW)

(72) Inventors: Hsueh-Chen Cheng, Hsinchu County (TW); Wen-Hong Hsu, Hsinchu (TW); Po-Hua Chen, Changhua County (TW); Yu-Yee Liow, Hsinchu County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/663,485

(22) Filed: Oct. 30, 2012

(51) Int. Cl.
*H03M 1/66* (2006.01)

(52) U.S. Cl.
USPC .......................................... 341/144; 341/145

(58) Field of Classification Search
USPC .................................. 341/144, 145
See application file for complete search history.

(56) References Cited

U.S. PATENT DOCUMENTS

| | | | |
|---|---|---|---|
| 6,650,266 B1* | 11/2003 | Tester | 341/144 |
| 6,720,898 B1 | 4/2004 | Ostrem | |
| 2004/0179416 A1* | 9/2004 | Ikeda et al. | 365/222 |
| 2006/0262625 A1* | 11/2006 | Dono et al. | 365/222 |
| 2007/0035988 A1* | 2/2007 | Matsui | 365/154 |

OTHER PUBLICATIONS

Walt Kester, MT-003 Tutorial, 2009.
Wikipedia, Thermal code is described in http://en.wikipedia.org/wiki/Unary_coding, Dec. 8, 2011.
Wikipedia, Monte Carlo analysis is described in http://en.wikipedia.org/wiki/Monte_Carlo_analysis, Oct. 22, 2012.

* cited by examiner

*Primary Examiner* — Jean B Jeanglaude
(74) *Attorney, Agent, or Firm* — Winston Hsu; Scott Margo

(57) ABSTRACT

A digital-to-analog converter includes a clock driver, a first decoder, a second decoder, a current source matrix, a pseudo random mode generator and at least one multiplexer. The first decoder and the second decoder are coupled to the clock driver. The current source matrix is coupled to the first decoder, and the pseudo random mode generator is used to randomly output a set of selecting signals. Each multiplexer of the at least one multiplexer includes a plurality of input ends coupled to a plurality of output ends of the second decoder, an output end coupled to the current source matrix, and a select end coupled to the pseudo random mode generator for controlling the output end to output a bit signal inputted from the input ends of the multiplexer according to one selecting signal of the set of selecting signals.

10 Claims, 4 Drawing Sheets

DIGITAL-TO-ANALOG CONVERTER

BACKGROUND OF THE INVENTION

1. Field of the Invention

The present invention relates to a digital-to-analog converter, especially a digital-to-analog converter capable of reducing harmonic distortion.

2. Description of the Prior Art

In the frequency field, the spurious-free dynamic range (SFDR) is an important indicator to analyze the linearity of signals. The SFDR is defined as the ratio of the root mean square (RMS) value of a signal and the RMS of the second highest noise of the signal, in other words, the SFDR can be viewed as the signal strength divided by the most significant spurious noise. The range of the SFDR is usually presented in dB, and spurious noise is generated by the nonlinearity of the amplifier caused due to the harmonic distortion.

In prior arts, a digital-to-analog converter is coupled to a plurality of signal lines for converting the signals transmitted from the plurality of signal lines. However, during the process of converting signals, a relatively large amount of errors may occur, thus generating harmonic distortion. This significantly reduces the range of the SFDR.

SUMMARY OF THE INVENTION

An embodiment of the present invention relates to a digital-to-analog converter, which comprises a clock driver, a first decoder, a second decoder, a current source matrix, a pseudo random mode generator and at least one multiplexer. The first decoder and the second decoder are coupled to the clock driver. The current source matrix is coupled to the first decoder, and the pseudo random mode generator is used to randomly output a set of selecting signals. Each multiplexer of the at least one multiplexer includes a plurality of input ends coupled to a plurality of output ends of the second decoder, an output end coupled to the current source matrix, and a select end coupled to the pseudo random mode generator for controlling the output end to output a bit signal inputted from the input ends of the multiplexer according to one selecting signal of the set of selecting signals.

Another embodiment of the present invention relates to a digital-to-analog converter, which comprises a clock driver, a first decoder, a second decoder, a current source matrix, a first pseudo random mode generator, a second pseudo random mode generator, at least one first multiplexer and at least one second multiplexer. The first decoder is coupled to the clock driver. The second decoder is coupled to the clock driver. The first pseudo random mode generator is used for randomly outputting a first set of selecting signals. The second pseudo random mode generator is used for randomly outputting a second set of selecting signals. Each first multiplexer of the at least one first multiplexer comprises a plurality of input ends coupled to a plurality of output ends of the second decoder, an output end coupled to the current source matrix, and a select end coupled to the first pseudo random mode generator for controlling the output end of the first multiplexer to output a bit signal inputted from the input ends of the first multiplexer according to one selecting signal of the first set of selecting signals. Each second multiplexer of the at least one second multiplexer comprises a plurality of input ends coupled to a plurality of output ends of the second decoder, an output end coupled to the current source matrix, and a select end coupled to the second pseudo random mode generator for controlling the output end of the second multiplexer to output a bit signal inputted from the input ends of the second multiplexer according to one selecting signal of the second set of selecting signals.

These and other objectives of the present invention will no doubt become obvious to those of ordinary skill in the art after reading the following detailed description of the preferred embodiment that is illustrated in the various figures and drawings.

DETAILED DESCRIPTION

Some phrases are referred to specific elements in the present specification and claims, please notice that the manufacturer might use different terms to refer to the same elements. However, the definition between elements is based on their functions instead of their names. Further, in the present specification and claims, the term "comprising" is open type and should not be viewed as the term "consisted of." Besides, the term "electrically coupled" can be referred to either directly connecting or indirectly connecting between elements. Thus, if it is described in the below contents of the present invention that a first device is electrically coupled to a second device, the first device can be directly connected to the second device, or indirectly connected to the second device through other devices or means.

The embodiments and figures are provided as follows in order to illustrate the present invention in detail, but please notice that the claimed scope of the present invention is not limited by the provided embodiments and figures.

Figure 1:
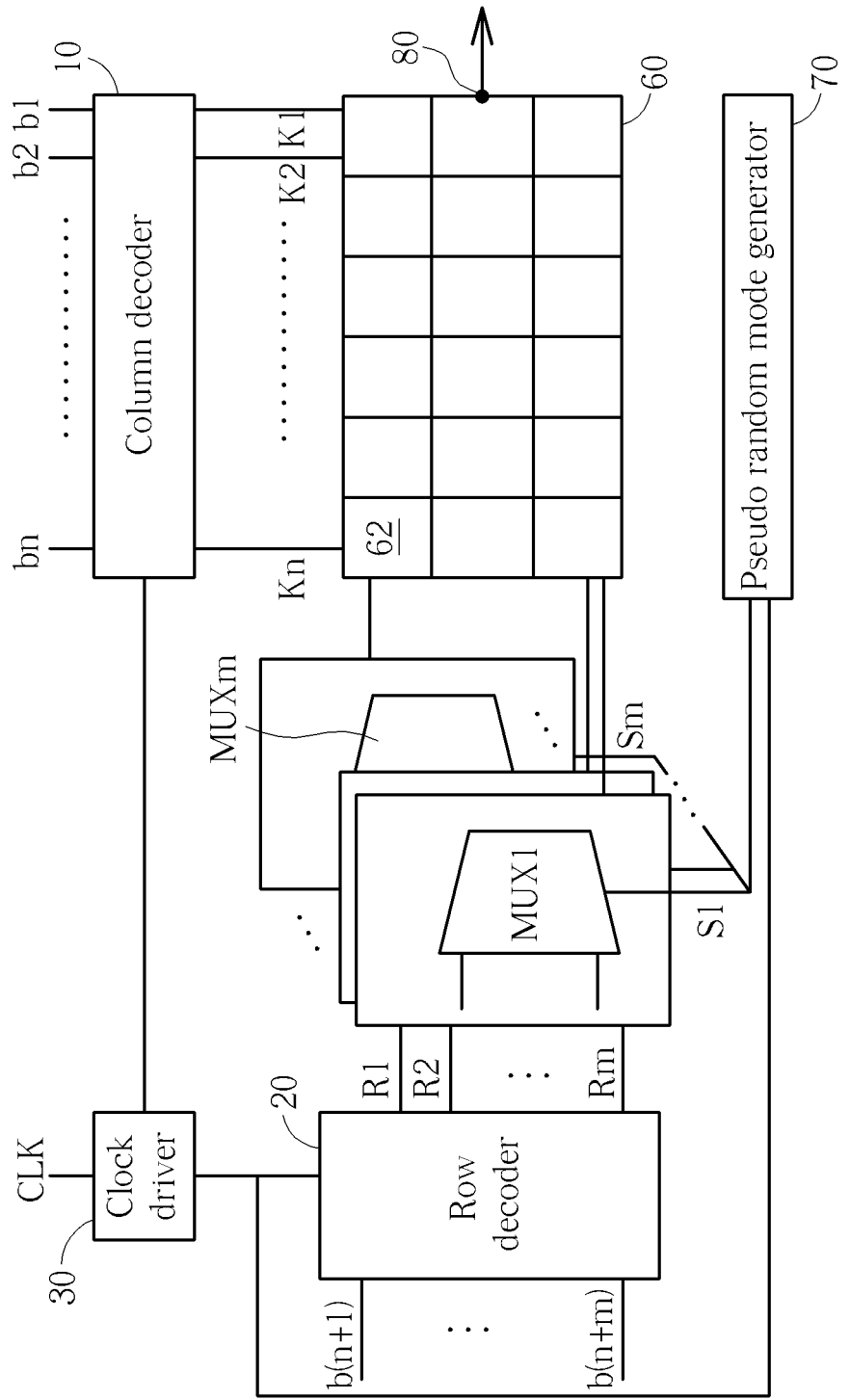
FIG. 1 shows a DAC according to a first embodiment of the present invention.

Please refer to FIG. 1, which shows a digital-to-analog converter (DAC) 100 according to a first embodiment of the present invention. As shown in FIG. 1, the DAC 100 comprises a clock driver 30, a column decoder 10, a row decoder 20, an m×n current source matrix 60, a pseudo random mode generator 70, a plurality of multiplexers MUX1 to MUXm, and a voltage output end 80. The column decoder 10 and the row decoder 20 are both coupled to the clock driver 30 and both receive a plurality of binary input signals b1 to bn and b(n+1) to b(n+m). After receiving the binary input signals b1 to b(n+m), the column decoder 10 and the row decoder 2 decode the binary input signals b1 to b(n+m) and output the decoded signals to the current source matrix 60 and the multiplexers MUX1 to MUXm. The column decoder 10 is coupled to the current source matrix 60 through a plurality of signal lines K1 to Kn, and the multiplexers MUX1 to MUXm are coupled to the row decoder 20 through a plurality of signal lines R1 to Rm. The pseudo random mode generator 70 is used to randomly output a plurality selecting signals S1 to Sm.

Each multiplexer of the multiplexer MUX1 to MUXm includes two input ends, an output end and a select end. The two input ends are coupled to two signal lines of the signal lines R1 to Rm, the output end is coupled to the current source matrix 60, and the select end is coupled to the pseudo random mode generator 70 for controlling the output end to output a bit signal inputted from the one of input ends of a multiplexer according to one selecting signal of the selecting signals S1 to Sm. For example, the two input ends of the multiplexer MUX1 are respectively coupled to the signal lines R1 and Rm, the two input ends of the multiplexer MUX2 are respectively coupled to the signal lines R2 and R(m−1), and so on, the two input ends of the multiplexer MUXm are respectively coupled to the signal lines Rm and R1. The voltage output end 80 is coupled to the plurality current source units 62 of the current source matrix 60 for generating an output voltage according to the current outputted from the current source units.

Figure 2:
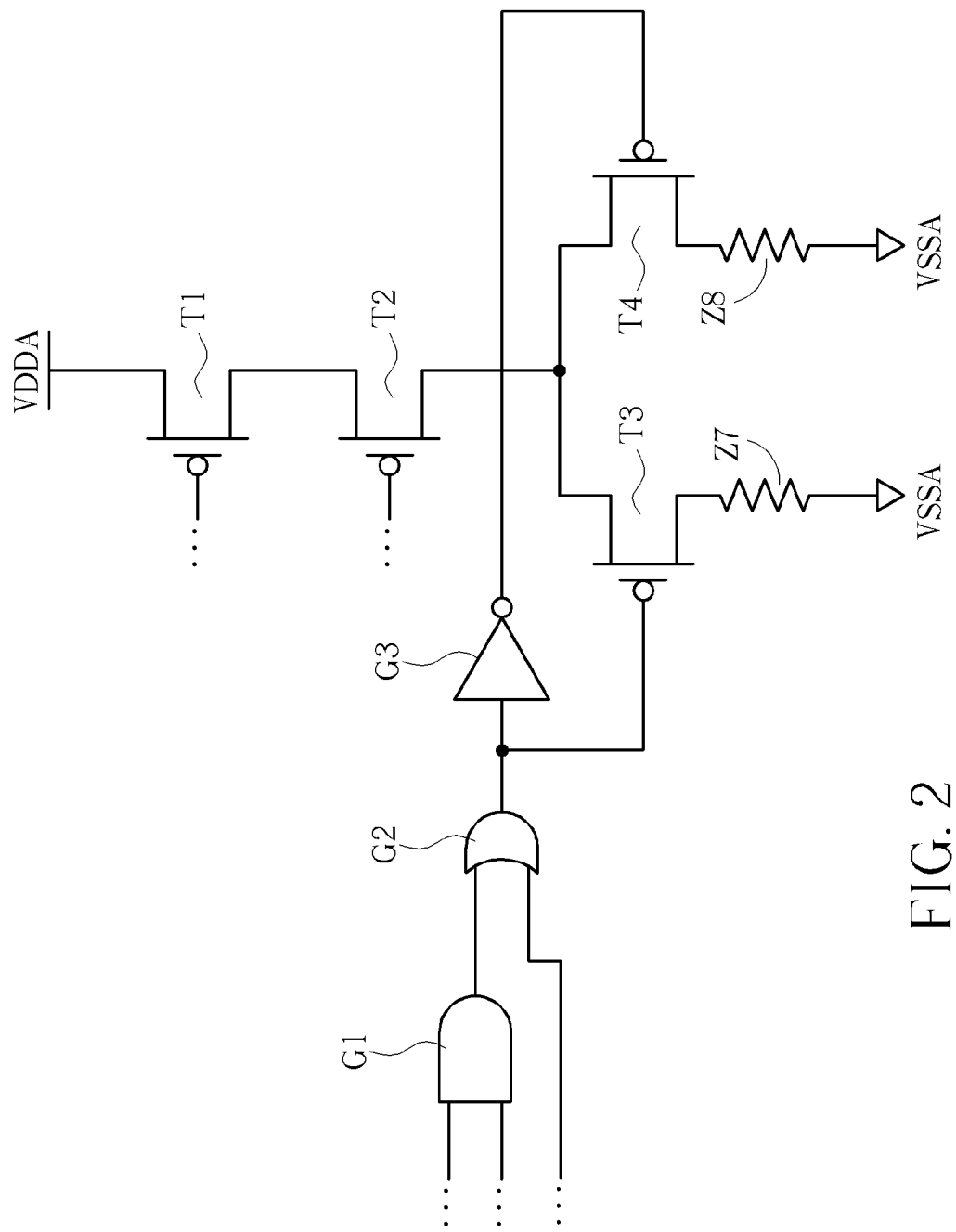
FIG. 2 shows the current source unit in FIG. 1.

Please refer to FIG. 2, which shows the current source unit 62 in FIG. 1. As shown in FIG. 2, The current source unit 62 includes an AND gate G1, a OR gate G2, an inverter G3, resistors Z7 and Z8 and switches T1 to T4. The switch T1 is coupled to the voltage source VDDA, and the resistors Z7 and Z8 are coupled to another voltage source VSSA. However, FIG. 2 is merely for example, not for limiting the claim scope of the current source units 62 of the present invention.

In the first embodiment, the line decoder 10 and the row decoder 20 can be thermometer-code decoders, or can be replaced with other type of decoders. Compared with a binary code decoder, a thermometer-code decoder changes only one bit when a current number varies to a next number. For example, when the binary code varies as 000, 001, 010, 011 . . . , the thermometer-code will vary as 1000000, 1100000, 1110000 . . . . Therefore, the glitch effect in the DAC 100 can be greatly reduced.

When the multiplexer MUX1 is coupled to the signal lines R1 and Rm, if the level of the selecting signal S1 transmitted to the multiplexer MUX1 is 0, the multiplexer MUX1 will output the signal transmitted from the signal line R1 to the current source matrix 60; if the level of the selecting signal S1 transmitted to the multiplexer MUX1 is 1, the multiplexer MUX1 will output the signal transmitted from the signal line Rm to the current source matrix 60. Therefore, although the pseudo random mode generator 70 randomly outputs the selecting signal S1 to Sm, the multiplexers MUX1 to MUXm still outputs the signals transmitted from the signal lines R1 to Rm to the current source matrix 60. However, the sequence of the signals outputted from the multiplexers MUX1 to MUXm might not be the same as the sequence of the signals outputted from the row decoder 20. Besides, the present invention does not limit the amount of the signal lines, the signal lines can be configured to be more or less, but the number of the multiplexers must be the same as the number of the output ends of the row decoders.

In the first embodiment, through the pseudo random mode generator 70 randomly outputting the selecting signals S1 to Sm to the multiplexers MUX1 to MUXm, the DAC 100 can randomly decide the manner that the multiplexers MUX1 to MUXm output the signals transmitted from the signal lines R1 to Rm to the current source matrix 60, thus averaging the errors generated from converting signals. Therefore, the harmonic distortion of the row signals in the DAC 100 can be reduced. Besides, the pseudo random mode generator 70 can apply various random algorithms, e.g. the Monte Carlo algorithm.

Figure 3:
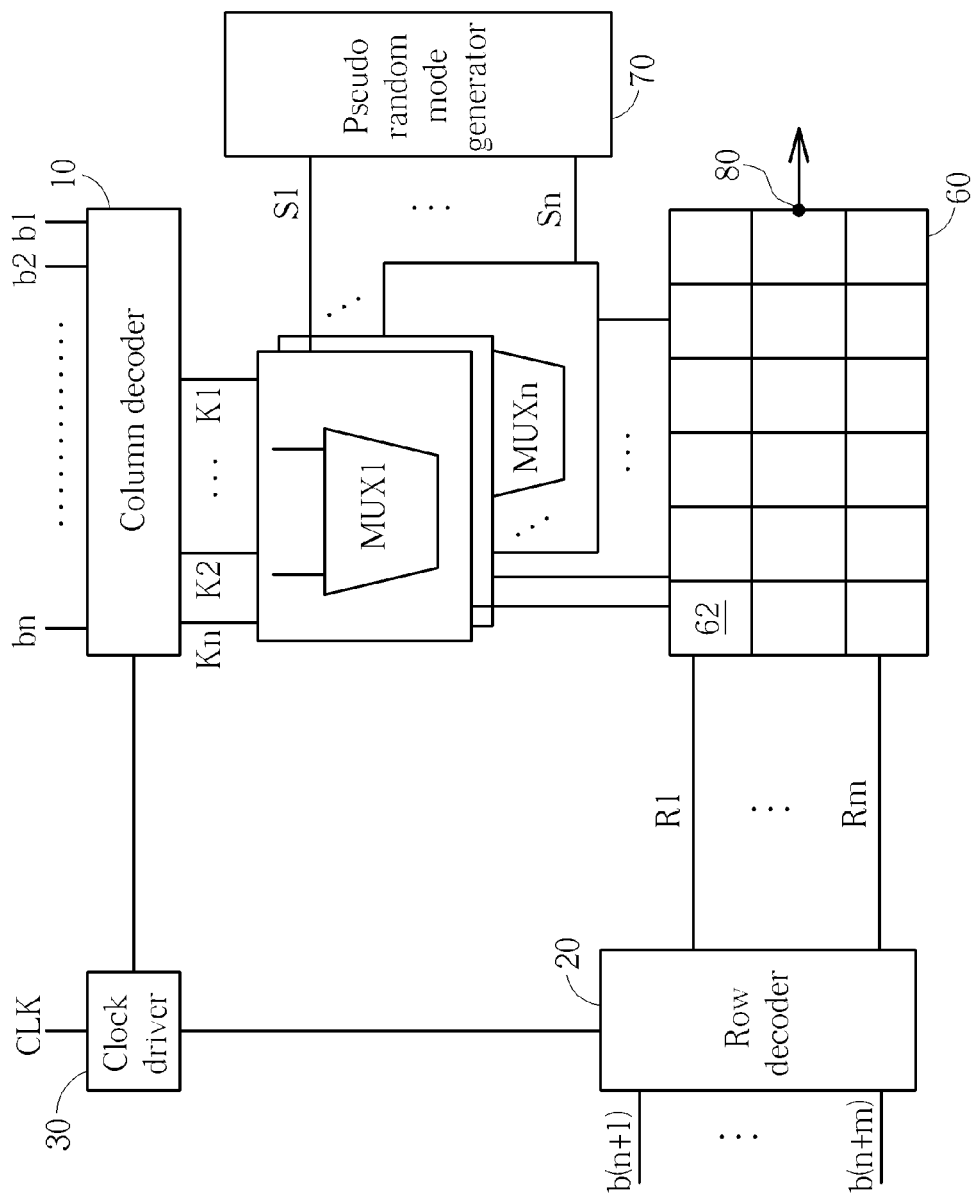
FIG. 3 shows a DAC according to a second embodiment of the present invention.

FIG. 3 shows a DAC 300 according to a second embodiment of the present invention. As shown in FIG. 3, the difference between the DACs 100 and 300 is that, in the DAC 300, the column decoder 10 is coupled to the multiplexers MUX1 to MUX through the signal lines K1 to Kn, and the row decoder 20 is coupled to the current source matrix 60 through the signal lines R1 to Rm. In other words, in the second embodiment, the multiplexers are coupled between the column decoder 10 and the current source matrix 60 instead of being coupled between the row decoder 20 and the current source 60.

Similarly, in the second embodiment, through the pseudo random mode generator 70 randomly outputting the selecting signals S1 to Sn to the multiplexers MUX1 to MUXn, the DAC 300 can randomly decide the manner that the multiplexers MUX1 to MUXn output the signals transmitted from the signal lines K1 to Kn to the current source matrix 60, thus averaging the errors generated from converting signals. Therefore, the harmonic distortion of the column signals in the DAC 300 can be reduced. Besides, the pseudo random mode generator 70 can apply various random algorithms, e.g. the Monte Carlo algorithm.

Figure 4:
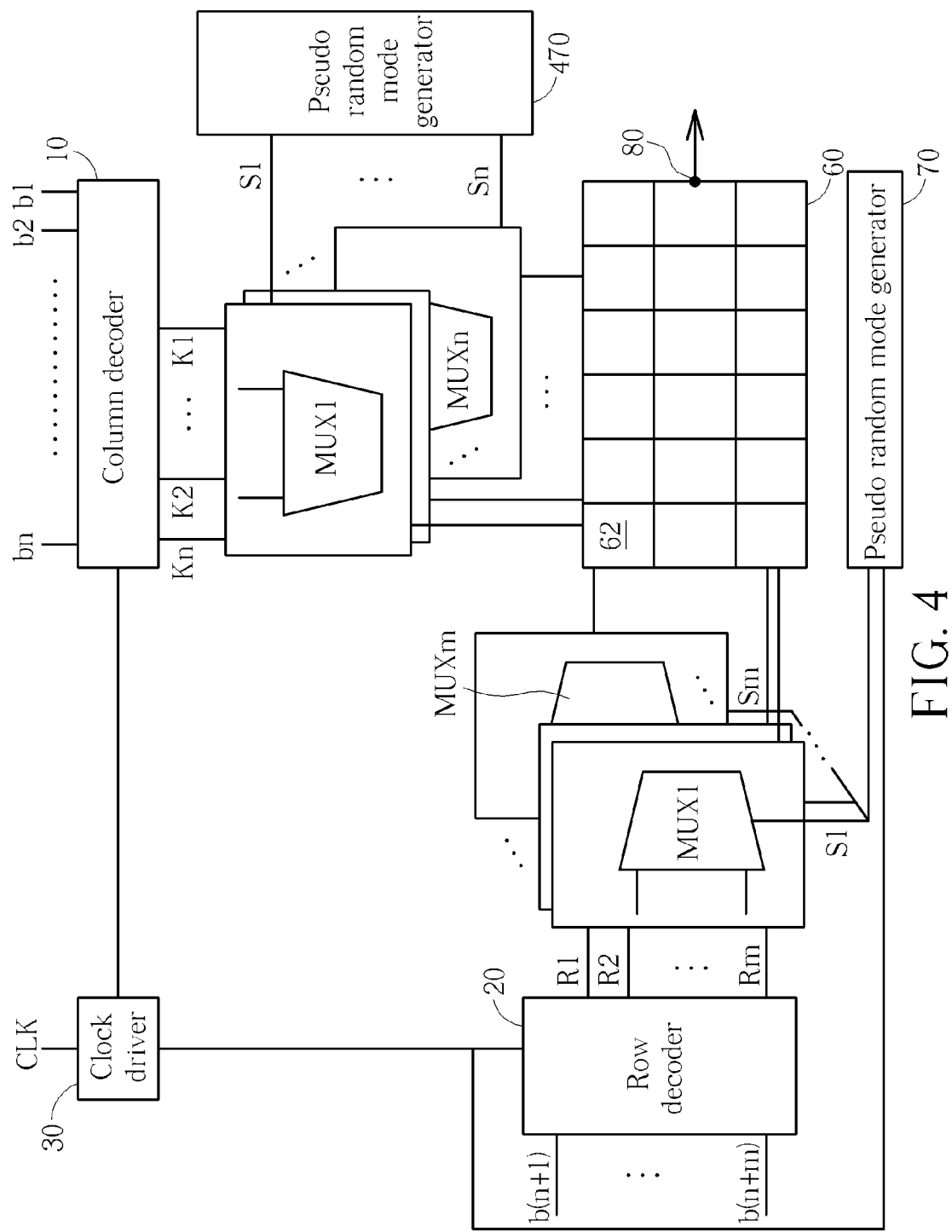
FIG. 4 shows a DAC according to a third embodiment of the present invention.

Please refer to FIG. 4, which shows a DAC 400 according to a third embodiment of the present invention. As shown in FIG. 4, the DAC 400 comprises a clock driver 30, a column decoder 10, a row decoder 20, a current source matrix 60, pseudo random mode generators 70 and 470, and multiplexers MUX1 to MUX(n+m). The row decoder 20 is coupled to the multiplexers MUX1 to MUXm, and the column decoder 10 is coupled to the multiplexers MUX(m+1) to MUX(m+n).

The pseudo random mode generator 70 is used for randomly outputting the selecting signals S1 to Sm, and the pseudo random mode generator 470 is used for randomly outputting the selecting signals S(m+1) to S(m+n). Each multiplexer of the multiplexers MUX1 to MUXm comprises two input ends coupled to two output ends of the row decoder 20, an output end coupled to the current source matrix 60, and a select end coupled to the pseudo random mode generator 70 for controlling the output end of the multiplexer to output a bit signal inputted from the two input ends of the multiplexer according to one selecting signal of the selecting signals S1 to Sm. Each multiplexer of the at multiplexers MUX (m+1) to MUX(m+n) comprises two input ends coupled to two output ends of the second decoder, an output end coupled to the current source matrix 60, and a select end coupled to the pseudo random mode generator 470 for controlling the output end of the multiplexer to output a bit signal inputted from the two input ends of the multiplexer according to one selecting signal of the selecting signals S(m+1) to s(m+n).

The difference between the first and third embodiments is that, in the third embodiment, besides the multiplexers MUX1 to MUXm being coupled between the row decoder 20 and the current source matrix 60, the multiplexers MUX(m+ 1) to MUX(m+n) are also coupled between the column decoder 10 and the current source matrix 60. Thus, in the third embodiment, through the pseudo random mode generator 70 randomly outputting the selecting signals S1 to Sm to the multiplexers MUX1 to MUXm, and the pseudo random mode generator 470 randomly outputting the selecting signals S(m+1) to S(m+n) to the multiplexers MUX(m+1) to MUX (m+n), the DAC 400 can randomly decide the manner that the multiplexers MUX1 to MUXm output the signals transmitted from the signal lines R1 to Rm to the current source matrix 60 and the manner that the multiplexers MUX(m+1) to MUX (m+n) output the signals transmitted from the signal lines K1 to Kn to the current source matrix 60, thus averaging the errors generated from converting signals. Therefore, the harmonic distortion in the DAC 400 can be reduced. Besides, through configuring the column decoder 10 and the row decoder 20 as thermometer-code decoder, the glitch effect in the DAC 400 can be improved.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A digital-to-analog converter comprising:
a clock driver,
a first decoder coupled to the clock driver;
a second decoder coupled to the clock driver;
a current source matrix coupled to the first decoder;
a pseudo random mode generator for randomly outputting a set of selecting signals; and
at least one multiplexer, each multiplexer of the at least one multiplexer comprising:
a plurality of input ends coupled to a plurality of output ends of the second decoder;
an output end coupled to the current source matrix; and
a select end coupled to the pseudo random mode generator for controlling the output end to output a bit signal inputted from the input ends of the multiplexer according to one selecting signal of the set of selecting signals.

2. The digital-to-analog converter of claim 1, wherein the first decoder comprises a column decoder, the second decoder comprises a row decoder, and the output end of each multiplexer is coupled to a row matrix of the current source matrix.

3. The digital-to-analog converter of claim 1, wherein the first decoder comprises a row decoder, the second decoder comprises a column decoder, and the output end of each multiplexer is coupled to a column matrix of the current source matrix.

4. The digital-to-analog converter of claim 1, wherein the first decoder and the second decoder are thermometer-code decoders.

5. The digital-to-analog converter of claim 1, further comprising a voltage output end coupled to a plurality of current source units for generating an output voltage according to current outputted from the plurality of current source units.

6. The digital-to-analog converter of claim 1, wherein each multiplexer comprises two input ends coupled to a plurality of output ends of the second decoder, and a number of the at least one multiplexer is equal to a number of the output ends of the second decoder.

7. A digital-to-analog converter comprising:
a clock driver,
a first decoder coupled to the clock driver;
a second decoder coupled to the clock driver;
a current source matrix;
a first pseudo random mode generator for randomly outputting a first set of selecting signals;
a second pseudo random mode generator for randomly outputting a second set of selecting signals;
at least one first multiplexer, each first multiplexer of the at least one first multiplexer comprising:
a plurality of input ends coupled to a plurality of output ends of the second decoder;
an output end coupled to the current source matrix; and
a select end coupled to the first pseudo random mode generator for controlling the output end of the first multiplexer to output a bit signal inputted from the input ends of the first multiplexer according to one selecting signal of the first set of selecting signals; and
at least one second multiplexer, each second multiplexer of the at least one second multiplexer comprising:
a plurality of input ends coupled to a plurality of output ends of the second decoder;
an output end coupled to the current source matrix; and
a select end coupled to the second pseudo random mode generator for controlling the output end of the second multiplexer to output a bit signal inputted from the input ends of the second multiplexer according to one selecting signal of the second set of selecting signals.

8. The digital-to-analog converter of claim 7, wherein the first decoder comprises a column decoder, the second decoder comprises a row decoder, the output end of each first multiplexer is coupled to a column matrix of the current source matrix, and the output end of each second multiplexer is coupled to a row matrix of the current source matrix.

9. The digital-to-analog converter of claim 7, wherein the first decoder and the second decoder are thermometer-code decoders.

10. The digital-to-analog converter of claim 7, further comprising a voltage output end coupled to a plurality of current source units for generating an output voltage according to current outputted from the plurality of current source units.

* * * * *